United States Patent [19]

Hongu et al.

[11] 3,852,676

[45] Dec. 3, 1974

[54] DETECTOR CIRCUIT

[75] Inventors: Masayuki Hongu, Tokyo; Isamu Ikeda, Yokohama, both of Japan

[73] Assignee: Sony Corporation, Tokyo, Japan

[22] Filed: Apr. 26, 1973

[21] Appl. No.: 354,681

[30] Foreign Application Priority Data

Apr. 28, 1972 Japan .............................. 47-43072

[52] U.S. Cl. ................................ 329/103, 307/233

[51] Int. Cl. ............................................ H03d 1/18

[58] Field of Search ........... 329/101, 102, 103, 110; 307/233, 232

[56] References Cited

UNITED STATES PATENTS

| | | | |
|---|---|---|---|
| 3,413,560 | 11/1968 | Van Anrooy | 329/103 |
| 3,414,828 | 12/1968 | Westover | 329/103 X |
| 3,593,171 | 7/1971 | Gassmann | 307/233 X |
| 3,609,396 | 9/1971 | Gassmann | 307/233 X |

*Primary Examiner*—Alfred L. Brody
*Attorney, Agent, or Firm*—Alvin Sinderbrand; Lewis H. Eslinger

[57] ABSTRACT

The detector circuit is divided into two parts, a signal current input section and a detector section. The signal current input section includes an input terminal which is supplied with a signal to be detected and which is connected to the base electrode of a first transistor whose collector electrode is connected through a first impedance to a first terminal of a voltage source and whose emitter electrode is connected through a second impedance to a second terminal of a voltage source. The detector section includes a second transistor whose collector electrode is connected through a load impedance to the first terminal of the voltage source and whose emitter electrode is connected through a diode to a second terminal of the voltage source, the diode being connected such that its conductive polarity is the same as the conductive polarity of the junction between the base and emitter electrodes of the second transistor with respect to the voltage source. Means are provided for connecting the emitter electrode of the second transistor to the collector electrode of the first transistor and the base electrode of the second transistor is based so that a small current flows through the second transistor and the diode when no input signal current is supplied. The output from the detector circuit is delivered at the collector electrode of the second transistor so that the detector circuit operates with great linearity over a wide range of input signal values.

11 Claims, 6 Drawing Figures

PRIOR ART

DETECTOR CIRCUIT

BACKGROUND OF THE INVENTION

The invention relates to detector circuits and more particularly to such circuits as used in television receivers.

In general, television receivers and the like employ a detector circuit for detecting the video signal. Such detector circuits are called second detectors when the receivers are of the heterodyne type. In such detector circuits a diode or a transistor is usually employed in one of a variety of well known circuit arrangements. Most such arrangements are operated in accordance with an input signal voltage of a level such that the output signal of the detector is essentially non-linear relative to the input signal. In situations where it is desired to operate the detectors in the relatively linear range it is necessary to maintain a high voltage level in the input signal. In television receivers in particular, such a high level input signal causes many kinds of undesirable problems such as oscillation or radiation which harms the quality of the pictures to be reproduced by the television receiver.

SUMMARY OF THE INVENTION

The above and other disadvantages are overcome by the present invention of a detector circuit having a signal current input means and a detector means. The signal current input means includes first and second constant current circuits connected in series between the terminals of a voltage source, the first constant current circuit producing a direct current $I_1$ on which is superposed an input signal current $\pm\Delta i$, the second current source producing a direct current $I_2$, the direction and values of the currents $I_1$ and $I_2$ being the same with respect to the terminals of the voltage source. The detector means includes an input and an output terminal, the input terminal being connected to a point between the first and second constant current circuits so that it is supplied with the input signal current $\pm\Delta i$ and the output terminal providing a detected signal.

In one preferred embodiment the signal current input means comprises an input terminal connected to the base of a first transistor whose collector electrode is connected through a first impedance means to a first terminal of a voltage source and whose emitter electrode is connected through a second impedance means to the other terminal of the voltage source. The detector means includes a second transistor and a load impedance connected between the collector electrode of the second transistor and the first terminal of the voltage source, a diode connected between the emitter electrode of the second transistor and the second terminal of the voltage source with the diode being oriented such as to have the same conductive polarity as the junction between the base and emitter electrodes of the second transistor, means for connecting the emitter electrode of the second transistor to the collector electrode of the first transistor and means for biasing the base electrode of the second transistor so that a small current flows through both the second transistor and the diode even when no input signal current is supplied. The output from the detector circuit is taken at the collector electrode of the second transistor.

In still another embodiment of the invention the detector means includes still a third transistor whose base and collector electrodes are connected to the emitter and collector electrodes, respectively, of the second transistor and whose emitter electrode is connected to the second terminal of the power source.

In still another embodiment the first impedance means of the signal current input means comprises a parallel L-C resonant circuit.

Accordingly, it is one object of the invention to provide a novel detector circuit which operates linearly even with a low level signal input.

It is another object of the invention to provide a detector circuit which operates with a superior linearity over a wide range of input signals.

Still another object of the invention is to provide a detector circuit which does not produce undesirable oscillation or radiation but which also operates in the linear range.

It is still a further object of the invention to provide a detector circuit which may be easily produced as an integrated circuit.

The foregoing and other objectives, features, and advantages of the invention will be more readily understood upon consideration of the following detailed description of certain preferred embodiments of the invention, taken in conjunction with the accompanying drawings.

DESCRIPTION OF CERTAIN PREFERRED EMBODIMENTS

Figure 1:
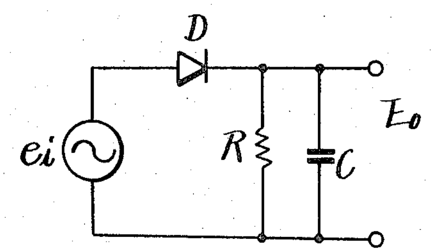
Fig-1 PRIOR ART
FIG. 1 is a schematic diagram of a detector circuit of the prior art type.

FIG. 1 is a circuit diagram of a video detector circuit of the prior art type for use in a television receiver. An input video intermediate frequency (VIF) signal voltage $e_i$ is supplied to a diode video detector D and an output video signal voltage $E_o$ is derived across an R-C parallel circuit. Because the diode D is operated in correspondence with the input signal voltage, the input-output characteristic of the diode detector circuit is determined in accordance with the equation of the voltage-current characteristic of the diode expressed as follows:

$$I_O = I_S \left\{ exp\ qVi/KT - 1 \right\} \tag{1}$$

where $I_O$ is the output current, $I_S$ is the saturation current, $q$ is the electronic charge, $Vi$ is the input voltage, K is the Boltzmann constant, T is the absolute temperature.

As can be seen from equation (1) the output current $I_O$ of the diode which corresponds to the output signal voltage $E_o$ in FIG. 1 is essentially non-linear relative to the input voltage $V_i$, which corresponds to the input signal $e_i$ in FIG. 1, so that if it is desired to operate the diode D in the relatively linear range of the level of the input signal voltage $e_i$ must be high and must be maintained in the range of several volts (rms).

In the case where the level of the input signal to the VIF amplifier (not shown in FIG. 1) is only 100$\mu$Vrms., the gain of the VIF amplifier must be higher than 80dB in order to obtain an input voltage to the detector which is in the range of several volts rms. The result, as explained above, is that various undesirable problems are thereby caused as for example oscillation due to regenerative feedback from the coupling circuits between the stages of the VIF amplifier and from the detector and from radiations from the high level voltage stages.

The detector circuits according to this invention are free from the defects encountered in the prior art because they can be operated by a low voltage level input signal and still obtain superior linearity.

In general, the following relationships are established between an input signal current $i_i$ an output current $i_o$ of a common emitter or a common base transistor amplifier:

$$i_o = h_{f_e}\, i_i \text{ (common emitter)} \quad (2)$$

$$i_o = \alpha\, i_i \text{ (common base)} \quad (3)$$

where $h_{f_e}$ represents the short-circuit transfer ratio or the current amplification factor in a common emitter circuit and $\alpha$ represents the same function in a common base circuit.

These relationships are satisfied even if the level of the input current $i_i$ is low. Accordingly, if the common emitter or a common base transistor circuit is operated in accordance with an input current based upon the relationship (2) or (3) irrespective of the equation (1), a detector circuit is thereby provided which operates linearly for a low level input signal. The present invention is based upon the above considerations.

Figure 2:
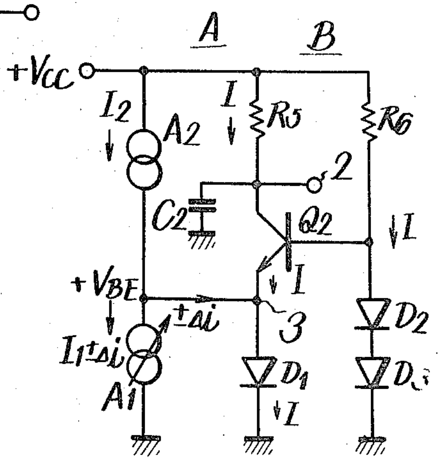
FIG. 2 is an idealized schematic diagram of one embodiment of the invention.

Referring now more particularly to FIG. 2, an idealized circuit diagram of one embodiment of the invention is depicted. The transistorized detector circuit of FIG. 2 is comprised of a signal current input section generally designated A and a detector section generally designated B.

The signal current input section A comprises first and second constant current sources $A_1$ and $A_2$ which are selected to have DC components $I_1$ and $I_2$ which are substantially equal in magnitude to each other. The constant current source $A_1$ is superposed with a VIF signal component $\pm \Delta i$ which drives the detector section B, as will be explained in greater detail hereinafter. The constant current source $A_2$ is connected from a first terminal of the voltage source +Vcc to one lead of the constant current source $A_1$. The other lead of the constant current source $A_1$ is connected to the circuit ground.

The detector section B is comprised of the first transistor $Q_2$ and a diode $D_1$. The collector electrode of the transistor $Q_2$ is connected through a load resistor $R_5$ to the first terminal of the voltage source Vcc. The collector electrode is also connected to the detector output terminal 2 and to the circuit ground through a smoothing capacitor $C_2$. The emitter electrode of the transistor $Q_2$ is connected to a signal input point 3 and to the circuit ground through the diode $D_1$ which is oriented so as to be conductive in the same direction as the base-emitter junction of the transistor $Q_2$. That is if the transistor $Q_2$ is an NPN, as illustrated in FIG. 2, its emitter electrode is connected to the anode of the diode $D_1$ and the cathode of the diode $D_1$ is connected to the circuit ground.

The junction between the current sources $A_1$ and $A_2$ is connected to the input point 3. The base electrode of the transistor $Q_2$ is connected to the first terminal of the voltage source Vcc through a bias resistor $R_6$ and to the circuit ground through a pair of diodes $D_2$ and $D_3$ connected in series such as to allow current to flow through the resistor $R_6$ to the circuit ground. The diodes $D_2$ and $D_3$ serve as bias diodes.

If the current through the diodes $D_2$ and $D_3$ is defined as I, current flowing through the collector load resistor $R_5$ of transistor $Q_2$ can also be defined as I because the emitter current of the transistor $Q_2$ and the current through the diode $D_1$ are also substantially I. This is due to the fact that the sum of the voltage drops across the diode $D_1$ and across the base-emitter junction of the transistor $Q_2$ must equal the total voltage drop across the diodes $D_2$ and $D_3$. Since the diodes $D_1$ to $D_3$ and the base-emitter junction of the transistor $Q_2$ all have substantially similar resistances it follows that the voltage drop across the diode $D_1$ corresponds to the voltage drop across the diode $D_3$ and therefore the current flowing through the diode $D_1$ must be equal to I. Furthermore since the current flowing through the base-emitter junction of the transistor $Q_2$ due to the base bias voltage is substantially null with respect to the magnitude of the current I it can be further assumed that the source of the current I through the base-emitter junction is the current flowing through the collector electrode of the transistor $Q_2$. Therefore it follows that a current of magnitude I flows through the load resistor $R_5$. The current I is selected to have a value of, for example, 50 microamperes ($\mu$A) so that the transistor $Q_2$ is made slightly conductive.

In the embodiment of FIG. 2 when the VIF signal component $\pm\Delta i$ is supplied to the point 3 through the constant current source $A_1$ it flows into two paths, namely into the transistor $Q_2$ or into the diode $D_1$. During its positive half cycle the VIF signal component $+\Delta i$ is of reverse polarity with respect to the PN junction between the emitter and base electrodes of the transistor $Q_2$ and therefore the transistor $Q_2$ is substantially instantaneously put into its cut-off state. However, the VIF signal component $+\Delta i$ is in the forward direction with respect to the biasing of the PN junction of the diode $D_1$ so that almost all of the signal $+\Delta i$ flows into the diode $D_1$ and thence to the circuit ground.

Conversely, during the negative half cycle of the VIF signal the diode $D_1$ is cut-off and the transistor $Q_2$ is made conductive so that during the cycle of $-\Delta i$ the transistor $Q_2$ supplies the current $\Delta i$ to the constant current source $A_1$. It is thus apparent that the diode $D_1$ and the transistor $Q_2$ are made conductive and non-conductive alternately at every half cycle of the VIF signal to carry out the detecting operation and to provide a half-wave detected output signal at the output terminal 2 connected to the collector of the transistor $Q_2$.

Figure 3:
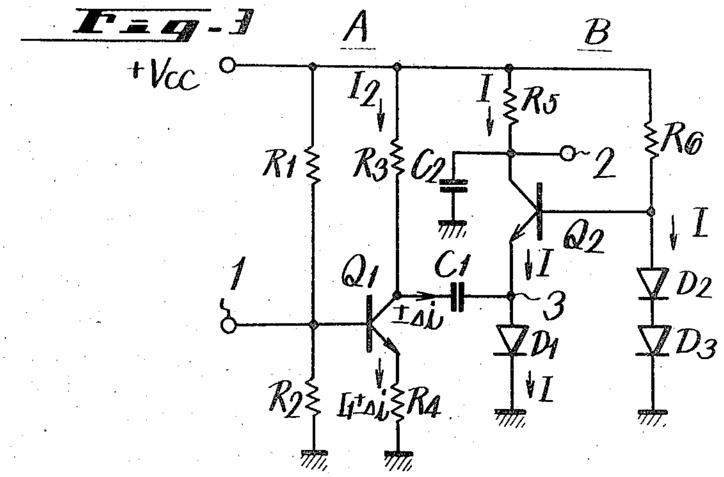
FIG. 3 is a more detailed schematic diagram of the circuit depicted in FIG. 2.

Referring now more particularly to FIG. 3 a more detailed diagram of the embodiment of FIG. 2 is illustrated. In the diagram of FIG. 3 the constant current sources $A_1$ and $A_2$ have been replaced with a single active element or first transistor $Q_1$. In this embodiment the transistor $Q_1$ is operated in a common emitter mode and its base electrode is supplied with the input VIF signal through a terminal 1. The base electrode of the transistor $Q_1$ is connected to the first terminal of the power source Vcc through a bias resistor $R_1$ and to the circuit ground through a resistor $R_2$. The collector electrode of the transistor $Q_1$ is connected to the first terminal of the power source Vcc through a load resistor $R_3$ and to point 3 through a capacitor $C_1$. The emitter electrode of the transistor $Q_1$ is connected to the circuit ground through a negative feedback resistor $R_4$.

The resistors $R_1$ and $R_2$ form a voltage divider for the base electrode of the transistor $Q_1$. By suitably selecting the value of the load resistor $R_3$ the input signal voltage applied at the terminal 1 is converted into a signal current component $\pm\Delta i$ by the transistor $Q_1$. The signal current is then delivered at the collector electrode of the transistor $Q_1$ and is supplied through the coupling capacitor $C_1$ to the detector section B. The operation of the detector section B in FIG. 3 is substantially the same as that described with reference to the embodiment in FIG. 2 and is based upon the equation (3) noted above and not upon the equation (1) so that even if the level of the inut signal is low an output signal with linear characteristics is nevertheless derived therefrom.

Figure 4:
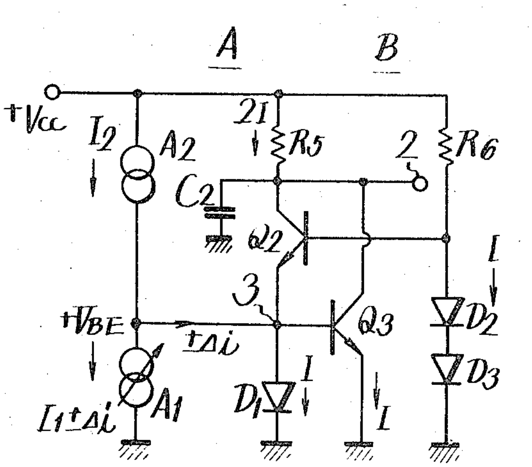
FIG. 4 is an idealized schematic diagram of a circuit according to a second embodiment of the present invention.

Referring now more particularly to FIG. 4 a modified embodiment of the present invention is illustrated in which a second detector transistor $Q_3$ is utilized. The same reference numerals used in FIGS. 2 and 3 have been applied to the corresponding elements of the circuit of FIG. 4. The transistor $Q_3$ has its collector electrode connected to the collector electrode of the transistor $Q_2$, its base electrode connected to the point 3, and its emitter electrode connected to the circuit ground. The remaining circuit construction is substantially the same as the embodiment of FIG. 2.

The circuit of the embodiment of FIG. 4 is designed so that the emitter current of the transistor $Q_3$ is approximately I and hence the current through the resistor $R_5$ is substantially 2I. This result follows from the fact that the bias applied to the base electrode of transistor $Q_3$ is the voltage drop across the diode $D_1$ produced by the current I flowing through the diode $D_1$. As explained above the resistance of the diode $D_1$ in its forward condition is approximately the same as the resistance of the base-emitter junction of the transistor $Q_3$ when it is forward biased. Therefore to produce a voltage equivalent to the voltage drop across the diode $D_1$ a current I must flow through the base-emitter junction of the transistor $Q_3$. Since little current flows through the base electrode to make up this current it is supplied through the collector electrode of the transistor $Q_3$. Therefore it follows that a current 2I must flow through the resistor $R_5$.

During the positive half cycle of the input signal current applied to the signal input point 3, the diode $D_1$ and the transistor $Q_3$ become conductive and a current equal to the current flowing through the diode $D_1$ flows through the emitter electrode of the transistor $Q_3$. At this point in time the transistor $Q_3$ operates upon the equation (2) above but the composite circuit of the transistor $Q_3$ and the diode $D_1$ must be considered together as a detector. If the normal current flowing through the diode $D_1$ is selected to be equal to that flowing through the emitter current of the transistor $Q_3$, that is both the currents are said to be I, then the current amplification factor $h_{fe}$ of the composite circuit becomes one. Accordingly, the input-output current characteristic of the composite circuit is therefore approximately based upon the equation (3). During the negative half cycle of the input signal current the diode $D_1$ and the transistor $Q_3$ are made non-conductive and the transistor $Q_2$ is made conductive to operate in the manner described above in reference to the embodiment of FIG. 3. The alternate output signal currents from the first and second transistors $Q_2$ and $Q_3$ are thus added together to deliver a full-wave detected output signal to the output terminal 2. The efficiency of this circuit is twice that of the embodiment of FIG. 3 or 6dB.

Figure 5:
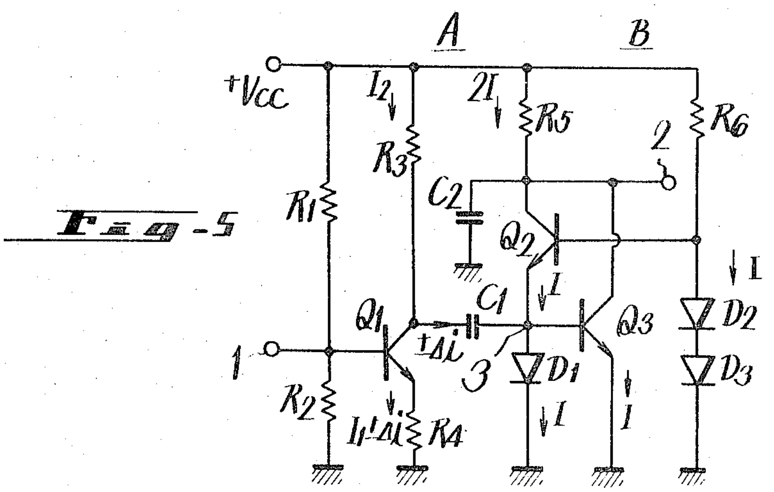
FIG. 5 is a more detailed schematic diagram of the embodiment of FIG. 4.

Referring now more particularly to FIG. 5 the constant current sources $A_1$ and $A_2$ are replaced with the signal current input section A of the embodiment of FIG. 4 and the same reference numerals have been applied. In operation, the transistor $Q_1$ of the current input section A operates in substantially the same manner as that described above with reference to FIG. 3 and the operation of the detector section B operates in the manner described above with reference to FIG. 4.

Figure 6:
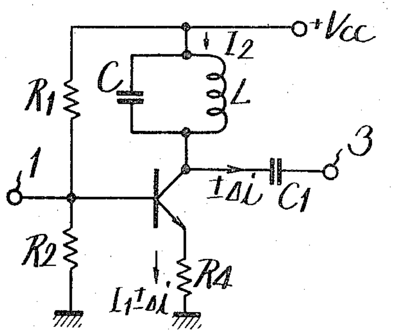
FIG. 6 is a schematic diagram of a modification to the embodiments of FIGS. 3 and 5.

FIG. 6 illustrates a modified circuit diagram in which a collector load resistor of the transistor $Q_1$ in the embodiments of FIGS. 3 and 5 is replaced with an L-C parallel resonance circuit consisting of a capacitor C connected in parallel with an inductor L. It is desirable that the load resistor $R_3$ in the embodiments of FIGS. 3 and 5 have a high impedance but there is the possibility that the impedance of the load resistor cannot be made high enough because of stray capacity. However, if the L-C parallel circuit resonates at the VIF signal frequency then it forms a (band-stop) high impedance and the constant current source $A_2$ is free from the influence of stray capacity and the constant current capability may be ideally realized.

In the above-described embodiments undesirable problems such as oscillation, radiation or the like are eliminated or minimized as compared with prior art diode detector circuits operated in response to an input signal voltage. The detector circuit of the present invention operates linearly to provide an output voltage in the range of several volts (peak-to-peak) even if the level of the input VIF signal is only in the range of a few decades of millivolts (mV). Therefore it will be understood to those skilled in the art that with the present invention a VIF amplifier with a gain lower than that of the prior art circuits by the order of 20 to 40 dB can be employed to the same effect. Furthermore the present invention is ideally suitable for construction as an integrated circuit.

The above-described detector circuit has been made with reference to its use in a television receiver but it will be easily understood by those skilled in the art that the detector circuit of the invention is suitable for use in other devices.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

What is claimed is:

1. A detector circuit comprising:

A. a power source having first and second voltage terminals,

B. signal current input means comprising first and second constant current circuits connected in series between the first and second voltage terminals, the first constant current circuit supplying a direct current $I_1$, means for superposing an input signal current $\pm\Delta i$ on the current $I_1$, the second current source supplying a direct current $I_2$, the direction of the currents $I_1$ and $I_2$ being the same with respect to the first and second voltage terminals, and the value of the currents $I_1$ and $I_2$ being substantially the same; and C. detector means comprised of a series circuit connected between said first and second voltage terminals, said series circuit including a transistor having input and output terminals for providing a detected signal at the output terminal in response to the input signal current $\pm\Delta i$ supplied to the input terminal, a load impedance connected to said output terminal and a diode connected to said input terminal and poled to conduct current when said transistor is conductive said input terminal being further connected to a connection point between the first and second constant current circuits, and said transistor being biased to a predetermined state of conductivity such that the transistor bias is varied as a function of said input signal current supplied to said input terminal.

2. A detector circuit according to claim 1; wherein the signal current input means comprises:

A. a signal input terminal supplied with a signal to be detected;

B. a further transistor having base, emitter, and collector electrodes;

C. first impedance means connected between the collector electrode and the first voltage terminal;

D. second impedance means connected between the emitter electrode and the second voltage terminal;

E. means for biasing the base electrode and including means for connecting the input terminal to the base electrode for applying the signal to be detected thereto; and F. means for connecting the collector electrode to the input terminal of the detector means; whereby the signal to be detected is converted to the input signal current $\pm\Delta i$ by the further transistor and is supplied to the input terminal of the detector means from the collector electrode.

3. A detector circuit according to claim 2; wherein the first impedance means is an L-C parallel resonance circuit.

4. A detector circuit comprising:

a voltage source;

signal current input means comprising first and second constant current circuits connected in series to said voltage source, the first constant current circuit supplying a direct current $I_1$, means for superposing an input signal current $\pm\Delta i$ on the current $I_1$, the second current source supplying a direct current $I_2$, the direction of the currents $I_1$ and $I_2$ being the same and the value of the currents $I_1$ and $I_2$ being substantially the same;

detector means having input and output terminals for providing a detected signal at the output terminal in response to the input signal current $\pm\Delta i$ supplied to the input terminal, the input terminal being connected to a connection point between the first and second constant current circuits, the detector means including:

a first transistor having base, emitter, and collector electrodes;

load impedance means connected between the collector electrode and the voltage source;

a diode connected to the emitter electrode so that the diode has the same direction of conductive polarity with respect to the voltage source as the junction between the base and emitter electrodes;

means for connecting the input terminal of the detector means to a connection point between the emitter and the diode;

biasing means for biasing the base electrode so that a small current flows through both the transistor and the diode when no input signal current is supplied; and means for connecting the collector electrode to the output terminal of the detector means.

5. A detector circuit according to claim 4; wherein the detector means further includes a second transistor having base, emitter, and collector electrodes, the base and collector electrodes of the second transistor being connected to the emitter and collector electrodes of the first transistor, respectively, and the emitter electrode of the second transistor being connected to a terminal of the voltage source.

6. A detector circuit according to claim 5; wherein the signal current input means comprises:

A. a signal input terminal supplied with a signal to be detected;

B. a third transistor having base, emitter, and collector electrodes;

C. first impedance means connected between the collector electrode of the third transistor and the voltage source;

D. second impedance means connected in series with the emitter electrode of the third transistor;

E. means for connecting the input terminal to the base electrode of the third transistor for applying the signal to be detected thereto; and F. means for connecting the collector electrode of the third transistor to the input terminal of the detector means, whereby the signal to be detected is converted to the input signal current $\pm\Delta i$ by the third transistor and is supplied to the input terminal of the detector means from the collector electrode of the third transistor.

7. A detector circuit according to claim 6; wherein the first impedance means is an L-C parallel resonance circuit.

8. A detector circuit according to claim 4; wherein the signal current input means comprises:

A. a signal input terminal supplied with a signal to be detected;

B. a second transistor having base, emitter, and collector electrodes;

C. first impedance means connected between the collector electrode of the second transistor and the voltage source;

D. second impedance means connected in series with the emitter electrode of the second transistor;

E. means for connecting the input terminal to the base electrode of the second transistor for applying the signal to be detected thereto; and F. means for connecting the collector electrode of the second transistor to the input terminal of the detector means; whereby the signal to be detected is converted to the input signal current $\pm\Delta i$ by the second transistor and is supplied to the input terminal of the detector means from the collector electrode of the second transistor.

9. A detector circuit according to claim 8; wherein the first impedance means is an L-C parallel resonance circuit.

10. A detector circuit comprising:

A. a voltage source having a pair of terminals;

B. a first transistor having base, emitter, and collector electrodes;

C. load impedance means connected between the collector electrode and one of the pair of terminals;

D. a diode connected between the emitter electrode and the other of the pair of terminals so that the diode has the same direction of conductive polarity as the junction between base and emitter electrodes with respect to the voltage source;

E. signal current input means supplying a signal current $\pm\Delta i$ to a connection point between the emitter and the diode;

F. biasing means for biasing the base electrode so that a small current flows through both the transistor and the diode when no input signal current is supplied; and G. an output terminal connected to the collector electrode.

11. A detector circuit according to claim 10; wherein the detector means further includes a second transistor having base, emitter, and collector electrodes, the base and collector electrodes of the second transistor being connected to the emitter and collector electrodes of the first transistor, respectively, and the emitter electrode of the second transistor being connected to the other of the pair of terminals.

* * * * *